US005385860A

United States Patent [19]
Watanabe

[11] Patent Number: 5,385,860
[45] Date of Patent: Jan. 31, 1995

[54] CHARGE TRANSFER DEVICE

[75] Inventor: Takashi Watanabe, Soraku, Japan

[73] Assignee: Sharp Kabushiki Kaisha, Osaka, Japan

[21] Appl. No.: 142,792

[22] Filed: Oct. 22, 1993

Related U.S. Application Data

[62] Division of Ser. No. 798,709, Nov. 26, 1991, Pat. No. 5,286,987.

[51] Int. Cl.$^6$ ............................................. H01L 21/339
[52] U.S. Cl. ..................................... 437/53; 437/148; 437/158
[58] Field of Search ................. 437/50, 53, 147, 148, 437/158; 148/DIG. 44; 257/220, 221, 248

[56] References Cited

U.S. PATENT DOCUMENTS

| | | | |
|---|---|---|---|
| 4,613,402 | 9/1986 | Losee et al. | 437/53 |
| 4,709,380 | 11/1987 | Itoh | 257/251 |
| 5,114,833 | 5/1992 | Erhardt | 437/53 |

FOREIGN PATENT DOCUMENTS

| | | | |
|---|---|---|---|
| 52-8782 | 1/1977 | Japan . | |
| 52-75189 | 6/1977 | Japan . | |
| 53-118379 | 10/1978 | Japan | 257/248 |
| 55-93264 | 7/1980 | Japan | 257/221 |

OTHER PUBLICATIONS

C. Sequin, M. Tompsett, "Charge Transfer Devices", Supplement Eight, Advances in Electronics And Electron Physics, 1975, pp. 32–38.

Primary Examiner—Brian E. Hearn
Assistant Examiner—Chandra Chaudhari
Attorney, Agent, or Firm—David G. Conlin; George W. Neuner

[57] ABSTRACT

In a charge transfer device having pairs of a first transfer electrode and a second transfer electrode on a semiconductor substrate, the ends of the second transfer electrode overlap the ends of the adjacent first transfer electrodes through an insulating film. A first region implanted with a first conductivity type is formed in the substrate, and a second region implanted with a second and different conductivity type is formed in the first region. The first region is disposed so that its upper stream end is positioned under a substantially medium portion of the first transfer electrode, and that the lower stream end of the first region is positioned under the upper stream end of the first transfer electrode of the succeeding electrode pair. The second region is disposed so that its upper stream end of the second region is positioned under the lower stream end of the first transfer electrode, and that the lower stream end of the second region is positioned under a substantially middle portion of the second transfer electrode.

1 Claim, 9 Drawing Sheets

CHARGE TRANSFER DEVICE

This is a divisional of copending application(s) Ser. No. 07/798,709 now U.S. Pat. No. 5,286,987, filed on Nov. 26, 1991.

BACKGROUND OF THE INVENTION

1. Field of the Invention

The present invention relates to a charge transfer device which is suitable for use as a two-dimensional image sensor or the like, and more particularly, the invention relates to a charge transfer device which can be produced in a high density, also to a method of producing the same.

2. Description of the Prior Art

As is well known in the art, the four-phase drive system shown in FIG. 12, the three-phase drive system in FIG. 13, and the two-phase drive system in FIG. 14 are the most common charge transfer systems which are employed in charge transfer devices (CTDs) such as charge coupled devices (CCDs) used as two-dimensional image sensors. A 1-($\frac{1}{2}$)-phase drive system is essentially the same as the two-phase drive system, the only difference being that one of the two phases in the two-phase drive system uses a DC potential.

When considering a unit of a bit configuration, one phase usually corresponds to one electrode in both the four-phase and three-phase drive systems. By contrast, in the two-phase drive system, one phase usually requires two electrodes in order to provide a built-in directionality of charge transfer.

Generally, the directionality of charge transfer is achieved by implanting an impurity such as Nb only under one transfer electrode within the same phase and thereby forming a potential barrier Vb as shown in FIG. 14.

With respect to the structure of electrodes, both the two-phase and four-phase drive systems permit the use of a two-layered structure, whereas the three-phase drive system requires a three-layered structure in order to maintain the equality of each bit. As a result, the two-phase or four-phase drive system is usually employed.

From the point of view of the maximum amount of charge transfer per unit area, the four-phase drive system provides the best characteristics because, as shown in FIG. 12, the storage area for a signal charge occupies more than 50% of the bit length and the effective potential difference can be provided by an amount equal to the clock amplitude Vc.

On the other hand, from the point of view of transfer efficiency, the two-phase drive system is the best choice because it permits an extended fringing electric field effect that determines the charge transfer in a high speed transfer operation. More specifically, in the two-phase drive system, since the directionality of charge transfer is formed as shown in FIG. 14, the fringing electric field effect acts throughout the period of charge transfer, which serves to prevent loss or back transfer of charge. Thus, the two-phase drive system provides a transfer efficiency superior to that achieved by any other drive system.

For the above-mentioned reasons, it is usual to employ the four-phase drive system for a slow speed transfer and the two-phase drive system for a high speed transfer.

In such a CCD, it is imperative to avoid an increase in the chip size. In order to increase the number of bits, therefore, the bit length must be made extremely short. A manner of accomplishing this in a two-dimension image sensor will be described.

As is well known, a two-dimension CCD image sensor consists of a plurality of pixels (photodiodes) arranged in a two-dimensional array, a plurality of rows of vertical shift registers for vertically transferring the signal charges accumulated at the pixels, and a horizontal shift register, usually a single row, for receiving the vertically transferred signal charges and transferring them in the horizontal direction for conversion into electrical signals.

Since the horizontal shift operation generally needs a high speed drive, the horizontal shift register uses the two-phase drive system, and has an electrode pattern as shown in FIG. 15. Encircled by a dashed line is an active region 20 which constitutes a CCD transfer channel in the horizontal shift register. A channel-stop region is formed outside the active region 20. Broken lines indicate first transfer electrodes 4, and solid lines second transfer electrodes 5. Clock signals $\phi_{H1}$ and $\phi_{H2}$ are applied via connections indicated by dotted lines to the transfer electrodes 4 and 5, respectively, through contact windows 22 indicated by marks "X".

The relationship between the bit length and the number of pixels in a horizontal row will be discussed. As the number of pixels increases, the bit length in a horizontal shift register (horizontal transfer section) is reduced. For example, in a $\frac{1}{2}$-inch optical system, when the number of effective pixels in a horizontal row is 510, the bit length is about 12.8 $\mu$m. Therefore, if the number of effective pixels is increased from 510 to 770, for example, the bit length will have to be reduced from about 12.8 $\mu$m to about 8.5 $\mu$m.

As can be seen from FIG. 15, the formation of four electrodes within the length of 8.5 $\mu$m demands a very strict control in processing, and consequently it is difficult to form the contact windows 22 through which potentials are applied to the electrodes. These dimension restrictions are almost the limit that the current techniques can attain. A further increase in the number of pixels (and hence a further reduction in the bit length) is not attainable by current techniques.

The above discussion applies not only to two-dimension image sensors but also to one-dimension image sensors and delay lines.

Next, a vertical shift register will be discussed. Two-dimension CCD image sensors are classified, according to the relationship between the photodiodes and the vertical shift registers, into the interline transfer type and the frame transfer type. In the following, the interline transfer method which is currently dominant will be described.

FIG. 16 diagrammatically shows the configuration according to a CCD image sensor. As shown, vertical arrays of photodiodes PD are arranged alternately with vertical shift register arrays, and signal charges in the photodiodes PD are read out by the adjacent vertical shift registers. Leads from transfer electrodes $\phi_{V1}$–$\phi_{V4}$ must be routed between the respective upper and lower photodiodes PD. When the transfer electrodes $\phi_{V1}$–$\phi_{V4}$ of the vertical shift registers are formed in two layers, four electrodes are needed per bit, so that two photodiodes PD are required for one bit. In such a CCD image sensor, consequently, the four-phase drive system is employed. The manner of driving the sensor in the two-phase drive system is the same as that of the four-phase drive system. Therefore, in one read operation, signal charges from alternate photodiodes PD in the vertical direction are read out, or signal charges from the vertically adjacent two photodiodes PD are added for reading. It is not possible to read out individual signal charges from all photodiodes PD by a single read operation.

Thus, with a prior art charge transfer device, it is not possible to further increase the density.

Generally, even the slightest misalignment between the boundary of directionality and the boundary of the electrode will result in potential dips or barriers, causing a decrease in the transfer efficiency.

The most commonly known solution to this problem is the so-called offset gate CCD (C. Sequin and M. Tompsett, "CHARGE TRANSFER DEVICES", 1975, Academic Press). However, this configuration involves the following disadvantages.

(1) In a surface-channel CCD (SCCD), as shown in FIG. 6, the potential $\phi_m$ decreases as the gate insulating film thickness $d_{ox}$ increases, but the difference $\phi_m$ decreases with a decrease in the gate voltage $V_G$. Unless the voltage is raised, a signal charge of a substantial amount cannot be attained for the low level side of the clock amplitude.

(2) In a buried-channel CCD (BCCD), as shown in FIG. 7, the potential $\phi_m$ increases with the increase of the gate insulating film thickness $d_{ox}$, and the accumulation region is at the greater $d_{ox}$ side. On the other hand, as the gate insulating film thickness $d_{ox}$ increases, the amount of signal charge per unit gate voltage decreases, which is disadvantageous from the point of view of a transferable charge amount.

In such a minimum-sized CCD, the transfer directionality may be incorporated by ion-implanting impurities. However, with the prior art technique, it is not possible to implant impurities below the first-level electrode and automatically align the boundary of the implanted region with the edge of the first electrode. More specifically, the implantation below the first electrode must be performed before the formation of the first electrode, but it is usually not possible to align its position with the position of the subsequently formed electrode even by using a third layer as shown in FIG. 8, because the first electrode on the third layer needs to be removed.

SUMMARY OF THE INVENTION

The charge transfer device of this invention, which overcomes the above-discussed and numerous other disadvantages and deficiencies of the prior art, comprises pairs of a first transfer electrode and a second transfer electrode, said pairs being arranged along a transfer direction, said first and second transfer electrodes being respectively disposed at the upper stream and lower stream of said transfer direction, and being formed on a semiconductor substrate, the upper stream end and lower stream end of said second transfer electrodes being respectively overlapped through an insulating layer over the lower stream end of said first transfer electrode of the respective electrode pair and the upper stream end of the first transfer electrode of the succeeding electrode pair, and said charge transfer device further comprises: a first region implanted with a first conductivity type in said semiconductor substrate, said first region being formed in the surface of said semiconductor substrate, and being under a portion of said first transfer electrode and the entire of said second transfer electrode; and a second region implanted with a second and different conductivity type in said first region, said second region being under a portion of said second transfer electrode.

In a preferred embodiment, said first region is disposed so that the upper stream end of said first region is positioned under a substantially medium portion of said first transfer electrode, and that the lower stream end of said first region is positioned under the upper stream end of the first transfer electrode of the succeeding electrode pair, and said second region is disposed so that the upper stream end of said second region is positioned under the lower stream end of said first transfer electrode, and that the lower stream end of said second region is positioned under a substantially middle portion of said second transfer electrode.

In a preferred embodiment, said first region is disposed so that the upper stream end of said first region is positioned under the lower stream end of said first transfer electrode, and that the lower stream end of said first region is positioned under a substantially medium portion of the first transfer electrode of the succeeding electrode pair, and said second region is disposed so that the upper stream end of said second region is positioned under a substantially medium portion of said second transfer electrode, and that the lower stream end of said second region is positioned under the upper stream end of the first transfer electrode of the succeeding electrode pair.

In another aspect of the invention, a charge transfer device comprises pairs of a first transfer electrode and a second transfer electrode, said pairs being arranged along a transfer direction, said first and second transfer electrodes being respectively disposed at the upper stream and lower stream of said transfer direction, and being formed on a semiconductor substrate, the upper stream end and lower stream end of said second transfer electrodes being respectively overlapped through an insulating layer over the lower stream end of said first transfer electrode of the respective electrode pair and the upper stream end of the first transfer electrode of the succeeding electrode pair, and said charge transfer device further comprises: a first region implanted with a first conductivity type in said semiconductor substrate, said first region being formed in the surface of said semiconductor substrate, and being under a portion of said first transfer electrode and the entire of said second transfer electrode; and a second region implanted with said first conductivity type in said first region, said second region being under a portion of said second transfer electrode.

In a preferred embodiment, said first region is disposed so that the upper stream end of said first region is positioned under a substantially medium portion of said first transfer electrode, and that the lower stream end of said first region is positioned under the upper stream end of the first transfer electrode of the succeeding electrode pair, and said second region is disposed so that the upper stream end of said second region is positioned under a substantially medium portion of said second transfer electrode, and that the lower stream end of said second region is positioned under the upper stream end of the first transfer electrode of the succeeding electrode pair.

In a preferred embodiment, said first region is disposed so that the upper stream end of said first region is positioned under the lower stream end of said first transfer electrode, and that the lower stream end of said first region is positioned under a substantially medium portion of the first transfer electrode of the succeeding electrode pair, and said second region is disposed so that the upper stream end of said second region is positioned under the lower stream end of said first transfer electrode, and that the lower stream end of said second region is positioned under a substantially medium portion of said second transfer electrode.

In the above-mentioned configurations, a buried channel of said first or second conductivity type may be formed in the surface of said semiconductor substrate, and said first region is formed in said buried channel.

According to the invention, a method of producing a charge transfer device is provided. The method comprises the steps of:

(a) forming a first electrode layer over a semiconductor substrate through an insulating layer;

(b) forming a first film and a first resist layer on said first electrode layer, said first film and said first resist layer having the same pattern;

(c) implanting a first impurity into said substrate through said first electrode layer and said insulating layer, with a high energy and using said first film and said first resist layer as a mask;

(d) removing said first resist layer;

(e) forming a second resist layer, said second resist layer extending from said first film at one end and to the center portion of gaps in said first film at the other end;

(f) etching said first electrode layer to form first transfer electrodes using said first film and second resist layer as a mask, said etching process being conducted so that the selectivity of said first film with respect to said first electrode layer is substantially great;

(g) removing said second resist layer;

(h) forming a third resist layer, said third resist layer extending from one of said first transfer electrodes at one end and to the center portion of gaps in said transfer electrodes at the other end;

(i) implanting a second impurity into said substrate through said insulating film, using said third resist layer and said first transfer electrodes as a mask;

(j) removing said third resist layer; and (k) forming second transfer electrodes.

Thus, the invention described herein makes possible the objectives of:

(1) providing a charge transfer device which can be constructed in a higher density;

(2) providing a charge transfer device in which the directionality for charge transfer can be established under a signal electrode;

(3) providing a charge transfer device in which the implantation region is formed in a self-aligned manner with respect to the edge of the first electrode;

(4) providing a charge transfer device in which there is no potential barrier or dip which may cause a failure in charge transfer;

(5) providing a method of producing a charge transfer device which can be constructed in a higher density;

(6) providing a method of producing a charge transfer device in which the directionality for charge transfer can be established under a signal electrode;

(7) providing a method of producing a charge transfer device in which the implantation region is formed in a self-aligned manner with respect to the edge of the first electrode; and (8) providing a method of producing a charge transfer device in which there is no potential barrier or dip which may cause a failure in charge transfer.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

With reference to the accompanying drawings, embodiments of the invention which are buried-channel CCDs will be described. For simplicity of description, in these CCDs, signal charges are electrons.

Figure 1A:
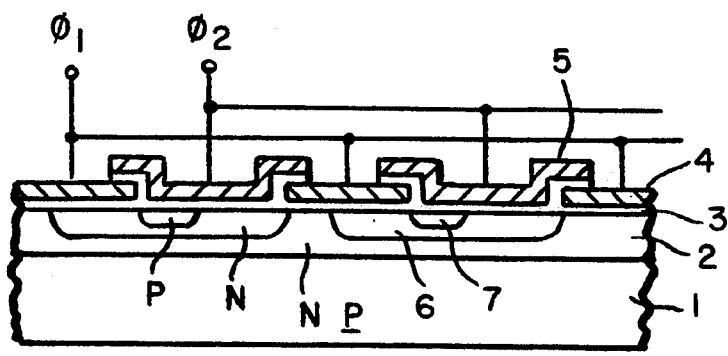
FIG. 1A diagrammatically illustrates an embodiment of the invention.
Figure 4:
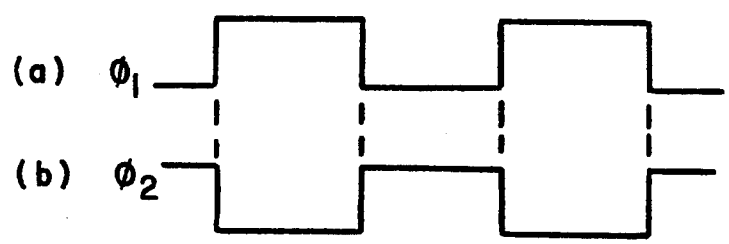
FIG. 4 shows transfer clock pulses used in the embodiment of FIG. 1A.

FIG. 1A shows a cross section along the transfer direction of an embodiment of the invention. In this CCD, an N-type semiconductor layer is formed at the surface of a P-type semiconductor substrate 1 along the entire length of a CCD transfer channel, to form a buried channel layer 2. On the surface of the semiconductor substrate 1, first transfer electrodes 4 are formed alternately with second transfer electrodes 5 along the transfer direction with a thin insulating film 3 of $SiO_2$ or the like interposed between them. A transfer clock pulse $\phi_1$ shown in (a) of FIG. 4 is applied to the first transfer electrodes 4, and a transfer clock pulse $\phi_2$ shown in (b) of FIG. 4 is applied to the second transfer electrodes 5.

In the CCD, directionality of charge transfer is provided by the structure described below, and charges are transferred from the left to the right in FIG. 1A. A first impurity is implanted into the surface of the semiconductor substrate 1 to form a first region 6 extending from the region under one half side of each first transfer electrode 4 through the entire region under the respective second transfer electrode 5 (more specifically, the first region 6 extends to the upper stream end of succeeding first transfer electrode 4). Then, a second impurity is implanted to form a second region 7 under one side of each second transfer electrode 5 (more specifically, the second region 7 extends from the lower stream end of the first transfer electrode 4).

Figure 1B:
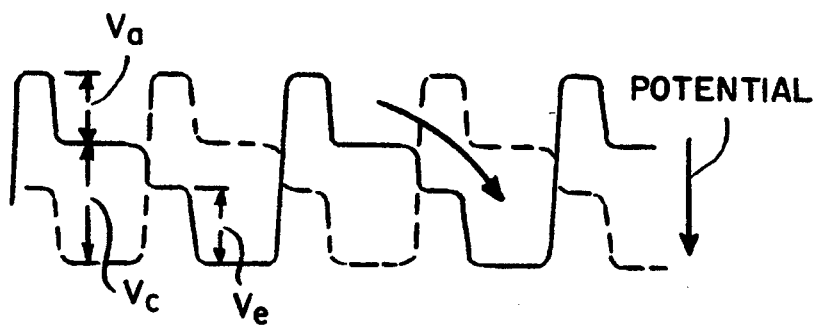
FIG. 1B is a diagram illustrating the potential distribution of the embodiment of FIG. 1A.

The potential profile provided by the above structure is shown in FIG. 1B. The first and the second impurities have the effect to make the potential deeper by $+Va$ and $-Ve$, respectively. That is, the first region 6 serves to form a potential step Va under each first transfer electrode 4, thereby providing directionality of charge transfer, and the second region 7 serves to form a potential step Ve under each second transfer electrode 5, thereby providing directionality of charge transfer. A potential difference Vc corresponds to the amplitude of the clock signal.

When the amounts of the implanted impurities are so set that the degrees of the potential shifts $+Va$ and $-Ve$ provided by the first and second impurities coincide with each other in a canceling fashion, the potential steps providing transfer directionality can be made to coincide with each other between the first and second transfer electrodes 4 and 5. When the second impurity is implanted into the region located in the position indicated in FIG. 1A, the directionality of potential depth formed under the transfer electrodes 4 and 5 can be effected in the transfer direction. As a result, the transfer clock pulses $\phi_1$ and $\phi_2$ can be used in the two-phase drive system with identical voltage conditions, as shown in FIG. 4.

In FIG. 1B, the solid line indicates the potential profile when the transfer clock pulse $\phi_1$ is low and the transfer clock pulse $\phi_2$ high, and the broken line shows the potential profile when the transfer clock pulse $\phi_1$ is high and the transfer clock pulse $\phi_2$ low. Therefore, transfer direction is from left to right in the figure.

By thus forming the potential steps under the respective transfer electrodes, the transfer electrode spacing can be reduced to about half that of the prior art configuration.

Since the above-described potential relationship still holds at the final stage in a charge transfer cycle, the fringing electric field is still present at the final stage in a charge transfer cycle, thus providing a potential barrier, Va, that prevents back transfer of a charge. As a result, no appreciable decrease in the transfer efficiency occurs even if the transfer cycle period is shortened, and consequently, a drastic increase in the transfer speed can be attained.

Figure 2:
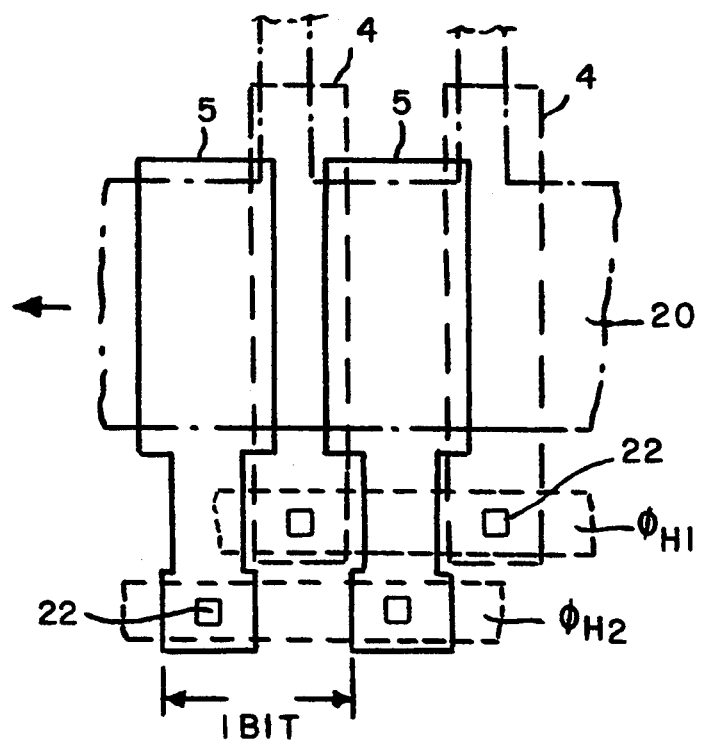
FIG. 2 is a diagram illustrating a horizontal shift register of a two-dimension image sensor to which the invention is applied.
Figure 15:
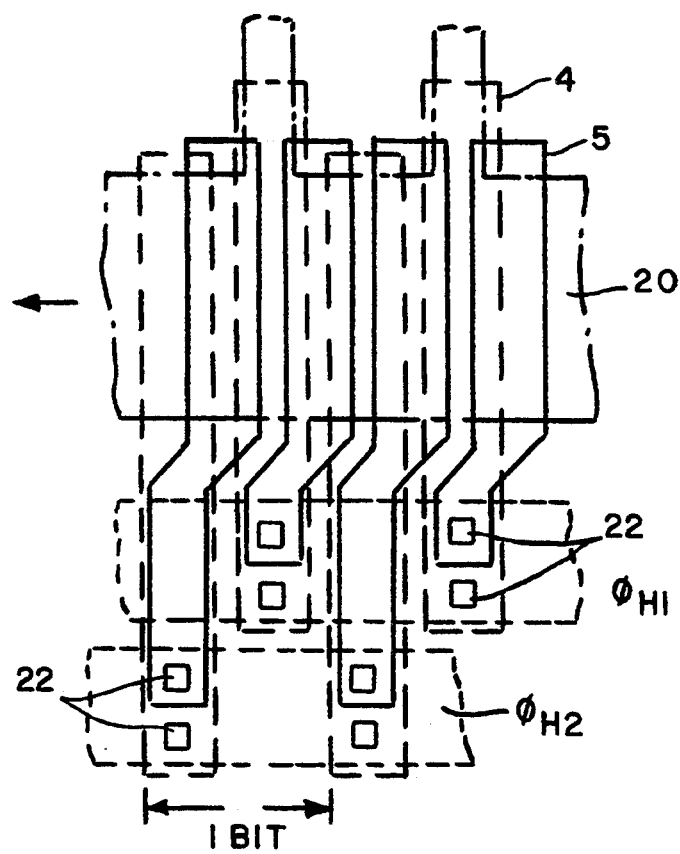
FIG. 15 is a diagram illustrating a horizontal shift register of a prior art two-dimension image sensor.

FIG. 2 shows the configuration of a horizontal shift register according to the invention which is applied to a two-dimensional image sensor. In this embodiment, transfer electrodes formed on an active region 20 are of a two-phase structure, and consequently, the electrodes per bit are reduced from four to two. Therefore, when the bit length is the same as that of the prior art construction, the respective widths of the transfer electrodes 4 and 5 are about two times as great as those of the prior art, as seen from the comparison of FIGS. 2 and 15. Furthermore, the opening area of each contact window 22 through which a transfer clock pulse is supplied is also about two times as great as that of the prior art. This makes the fabrication that much easier.

On the other hand, when the widths of the transfer electrodes 4 and 5 and the area of each contact window 22 are the same as those in the prior art, a bit density which is two times as great as that of the prior art can be achieved.

Figure 3:
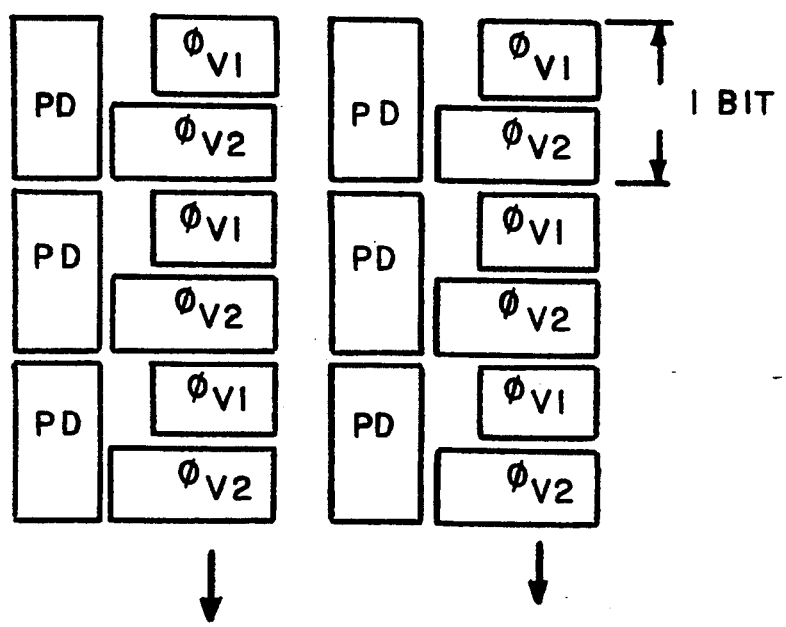
FIG. 3 is a diagram illustrating a vertical shift register to which the invention is applied.
Figure 16:
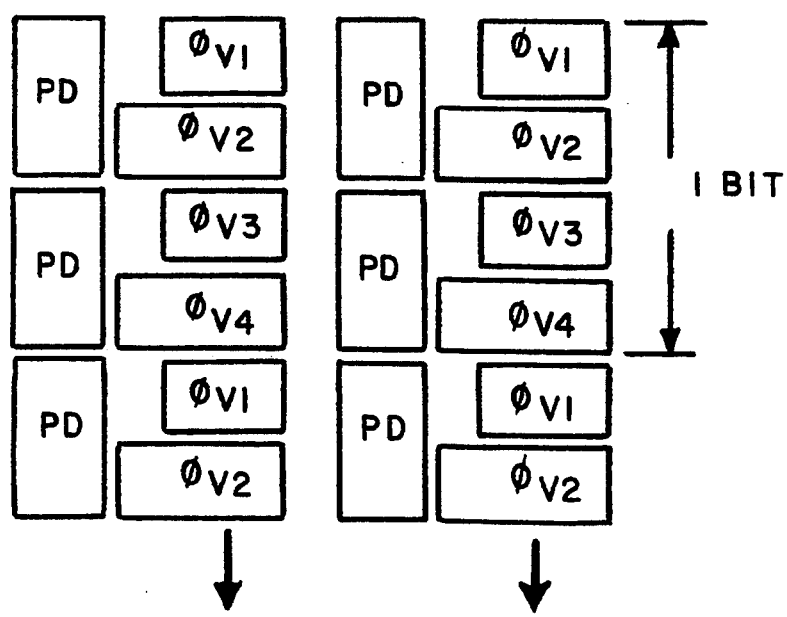
FIG. 16 is a diagram illustrating photodiode arrays and vertical shift register arrays in a CCD image sensor.

FIG. 3 shows the configuration of vertical shift registers according to the invention which is applied to an interline transfer device. Vertical rows of photodiodes PD are arranged alternately with vertical shift register arrays, and signal charges at the photodiodes PD are read out by the adjacent two-phase clocked vertical shift registers. Leads from the transfer electrodes $\phi_{V1}$ and $\phi_{V2}$ must be routed between the respective upper and lower photodiodes PD. According to the invention, since two electrodes are provided per bit, when the transfer electrodes $\phi_{V1}$ and $\phi_{V2}$ are formed in a two-layered structure, one photodiode PD is required per bit. This makes it possible to read out individual signals from all photodiodes PD by a single read operation. As a result, the vertical resolution per read operation is doubled as compared with the prior art example shown in FIG. 16.

Figure 5A:
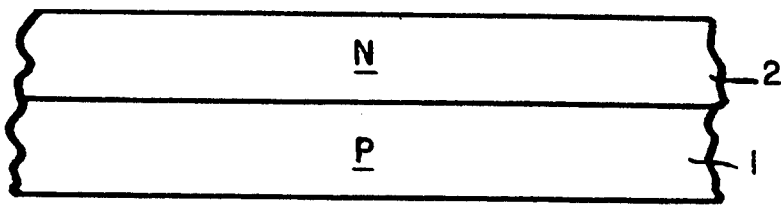
FIGS. 5A to 5C are sectional views illustrating the process of producing the embodiment of FIG. 1A.

A method of producing a CCD according to the invention will be described with reference to FIGS. 5A to 5G. For example, phosphorus ion is implanted as an N-type impurity into the surface of a P-type boron-doped Si substrate 1 (boron: $3 \times 10^{15}$ cm$^{-3}$) to form a buried channel layer 2 having the concentration of $5 \times 10^{16}$ cm$^{-3}$ and the depth of 400 nm (FIG. 5A).

Figure 5B:
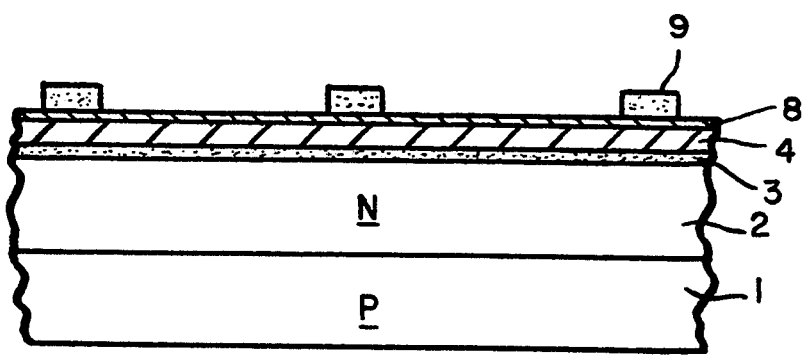

Next, the surface of the Si substrate 1 is oxidized to form a thin SiO$_2$ film 3 (80 nm) as a gate insulating film. On the gate insulating film 3, a polysilicon film which serves as the first transfer electrode 4 is formed. The surface of the polysilicon film 4 is oxidized to form an SiO$_2$ film 8 which can provide a sufficient etching selectivity with respect to the polysilicon film (first transfer electrode) 4 (in other words, the etching rate of the SiO$_2$ film 8 in a reactive ion etching (which will be conducted later) is sufficiently greater than that of the polysilicon film 4). The resulting thickness of the polysilicon film 4 is 500 nm. A resist pattern 9 is selectively deposited on the surface of the SiO$_2$ film 8 (FIG. 5B).

Figure 5C:
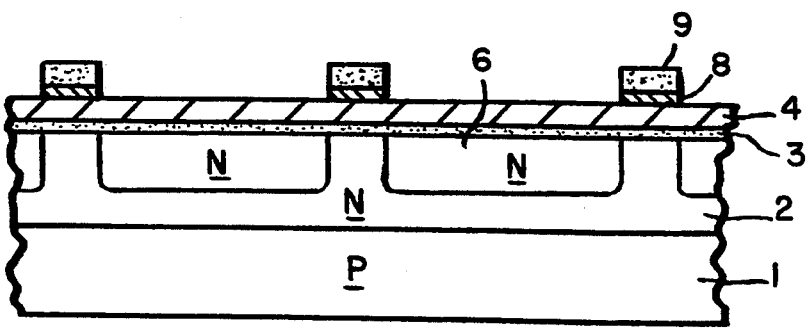

Using the resist pattern 9 as a mask, the SiO$_2$ film 8 is selectively etched to be patterned by the reactive ion etching technique. Thereafter, using the thus patterned film 8 and the resist pattern 9 as a mask, phosphorus ion is doped as an N-type impurity at a high energy (500 keV) into the surface of the substrate 1, penetrating the polysilicon film (transfer electrode) 4 and the gate insulating film 3, to form a first region (N-type impurity region) 6 (concentration: $8 \times 10^{16}$ cm$^{-3}$, depth: 200 nm) in the buried channel 1 2 (FIG. 5C).

Figure 5D:
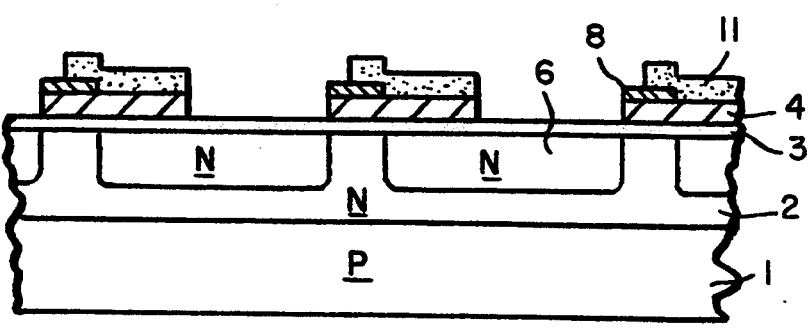

After the first region 6 has been formed, the resist pattern 9 is removed, and then a resist pattern 11 is formed as shown in FIG. 5D, so as to overlap an unetched portion of the SiO$_2$ film 8 at one end with the other end extending halfway into the adjacent gap between the unetched patterns of the film 8. Using the thus formed resist pattern 11 and the SiO$_2$ film 8 as a mask, the polysilicon film 4 is patterned by the reactive ion etching technique to form first transfer electrodes (FIG. 5D).

As a result of these patterning treatments, the first region 6 is formed with one edge (the lower stream end) thereof bordering on one edge (the upper stream end) of the transfer electrode 4 and the other edge (the upper stream end) extending up to a region below the center of the adjacent transfer electrode 4.

Figure 5E:
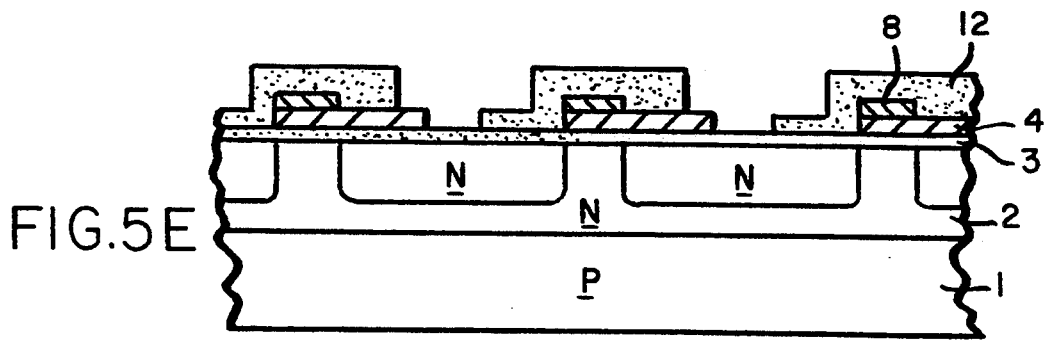

Next, the resist pattern 11 is removed, and a resist pattern 12 is formed in such a manner as to overlap one transfer electrode 4 at one end, with the other end extending halfway into the adjacent gap between the opposing transfer electrodes 4 (FIG. 5E).

Figure 5F:
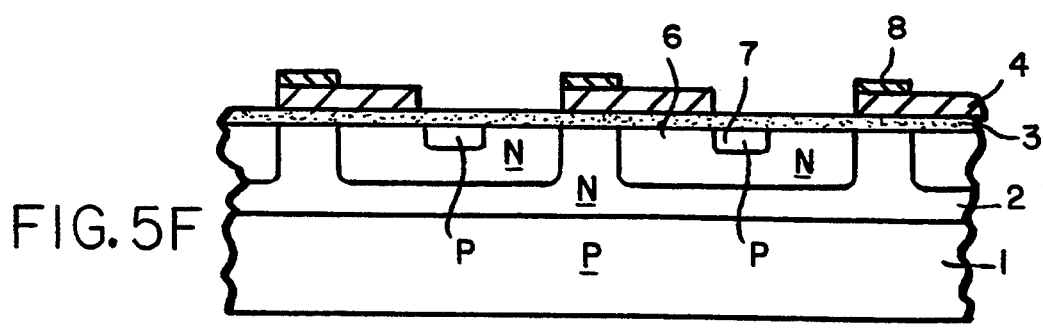
Figure 5G:
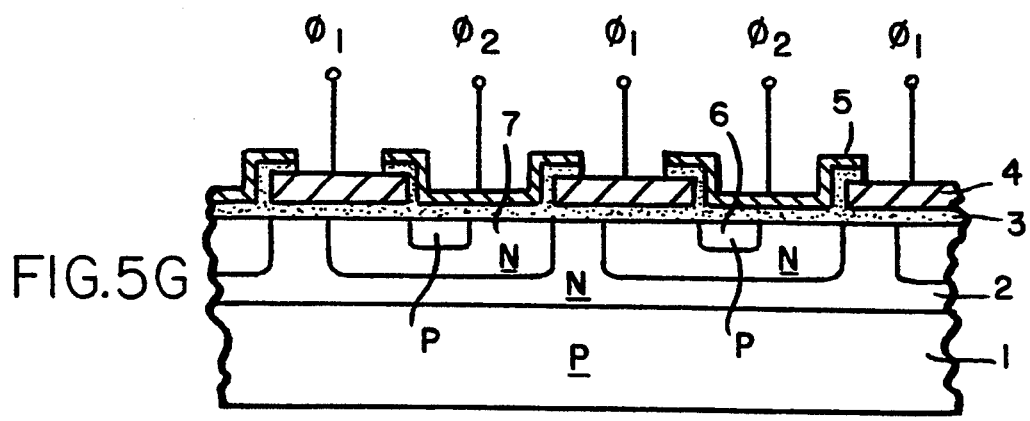
Figure 6:
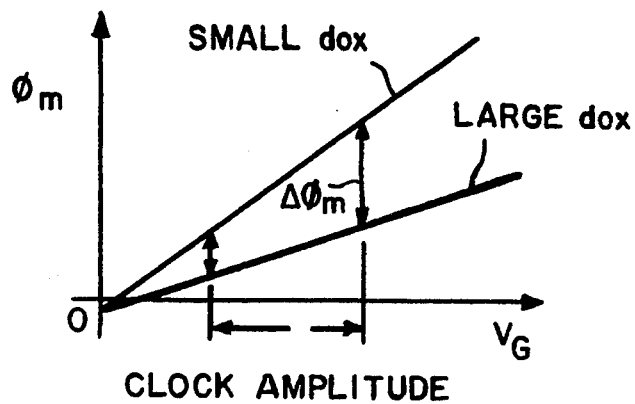
FIGS. 6 and 7 are graphs showing the relationship between the thickness of the gate potential, the gate insulating film thickness, and the gate voltage in a surface-channel CCD and a buried-channel CCD, respectively.
Figure 7:
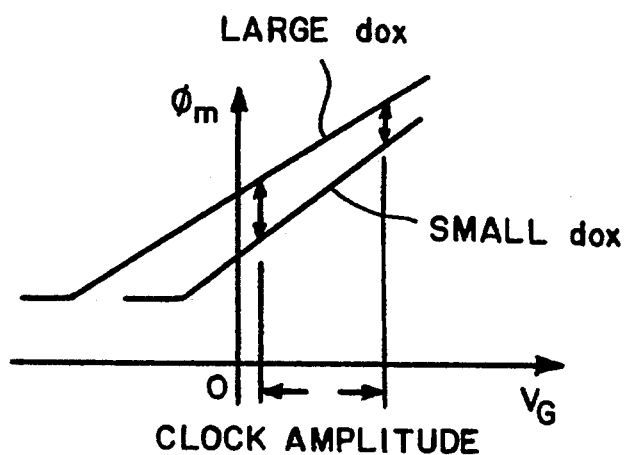
Figure 8:
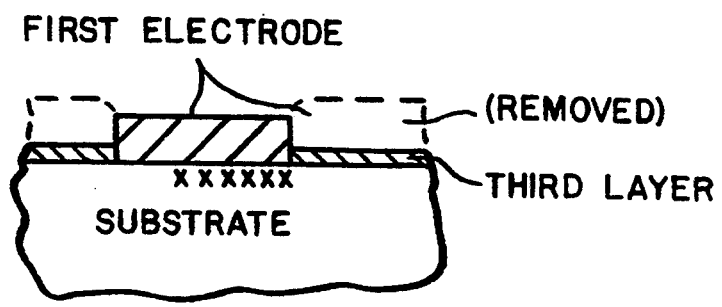
FIG. 8 diagrammatically illustrates a production process of a CCD.

Thereafter, using the resist pattern 12 as a mask, boron is implanted as a P-type impurity to form a second region 7 (concentration (N-type): $5 \times 10^{16}$ cm$^{-3}$, depth: 200 nm) as shown in FIG. 5F. In the second region 7, boron just compensates phosphorus. After the completion of the impurity implantation, the resist pattern 12 and the SiO$_2$ film 8 are removed. Then, using a known technique, second transfer electrodes 5 are formed in such a manner that the upper and lower stream ends of each transfer electrode 5 overlap through a thin SiO$_2$ film the lower stream end of one of the first transfer electrodes 4 and the upper stream end of the succeeding first transfer electrode 4, respectively (FIG. 5G). With the formation of the second transfer electrodes 5, the production process for the CCD is completed.

The production method described above has the following features: first, the first region 6 is formed by the high energy implantation in which the SiO$_2$ film 8 and resist pattern 9 are used as a mask and which is conducted through the polysilicon film 4 (which will serve as the first transfer electrode); and second, the polysilicon film 4 is etched so that the portions of the polysilicon film 4 under the patterned SiO$_2$ film 8 are left. Only when the production method having such features is employed, it is possible to provide directionality of charge transfer, without causing potential barriers or potential dips to a minimum-sized CCD.

According to the invention, the directionality of charge transfer can be provided within a single electrode, and the CCD density can be doubled. As described above, even the slightest misalignment between the boundary of directionality and the boundary of the electrode will result in potential dips or barriers, causing a decrease in the transfer efficiency, and, with the prior art technique, it is not possible to implant impurities below the first electrode and automatically align the boundary of the implanted region with the edge of the first electrode.

According to the invention, a high energy implantation is used so that the implantation below the first transfer electrode can be performed after the formation of the layer for the first transfer electrode. In this process, the third layer (SiO$_2$ film 8) is formed on the first electrode layer, and the third layer and a resist layer having the same pattern as the third layer are used as a mask for the implantation so that the portion of the first electrode layer under the third layer is left unetched to form the first transfer electrode. Therefore, the implantation is not only introduced under the first transfer electrode but also below the adjacent second transfer electrode. As a result, the boundary of the implanted region can be aligned with the edge of the first transfer electrode.

Since the first and second regions are formed so that one ends of these regions are automatically aligned with the respective one ends of the first and second transfer electrodes, there occur no potential barriers or dips that cause a charge transfer failure. Therefore, a higher processing accuracy is not specifically required in view of the transfer efficiency. Also, since the other ends of the first and second regions terminate at the center portions of the respective transfer electrodes, the processing accuracy only slightly affects the maximum amount of charge.

Figure 9:
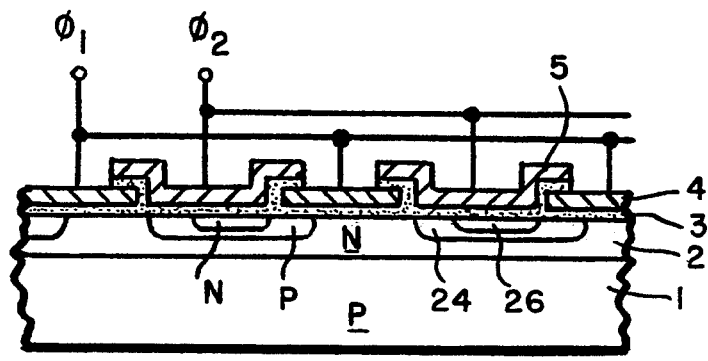
FIG. 9 is a diagram illustrating another embodiment of the invention.

The position of the second region may differ depending upon the conductivity type of the second region. That is, when the first and second regions 6 and 7 are to have different conductivity types, the second region 7 is approximately centered at the surface of the first region 6 as shown in FIG. 1A. In the CCD of FIG. 1A, the conductivity type of the second region 7 is different from with that of the buried channel 2 and also from that of the second region 7. FIG. 9 shows another CCD according to the invention in which the conductivity type of the second region 26 is identical with that of the buried channel 2 but different from that of the first region 24.

Figure 10A:
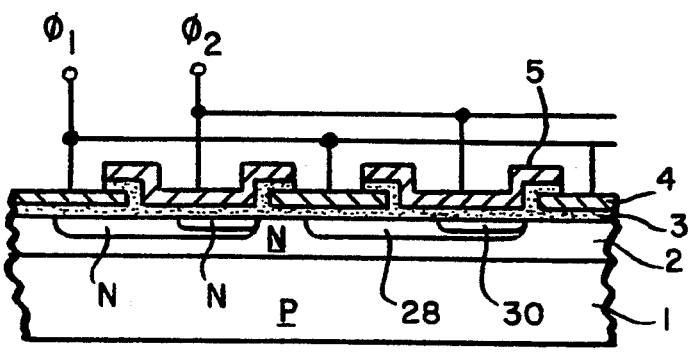
FIG. 10A is a diagram illustrating a further embodiment of the invention.
Figure 11:
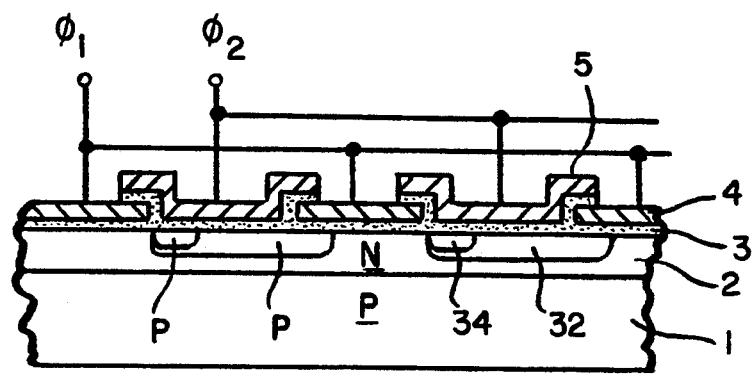
FIG. 11 is a diagram illustrating a still further embodiment of the invention.
Figure 12:
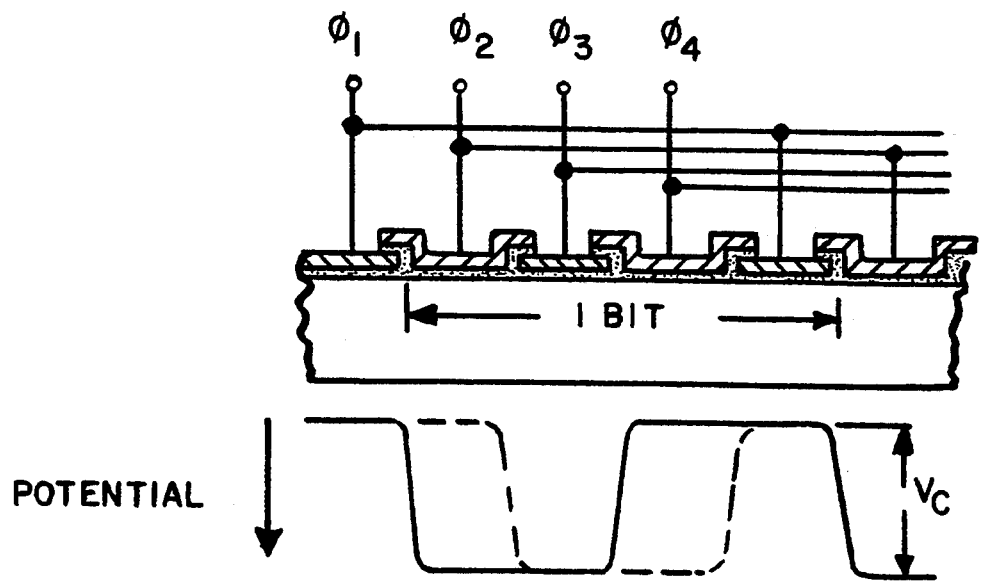
FIGS. 12 to 14 illustrate various prior art devices and potential distributions therein.
Figure 13:
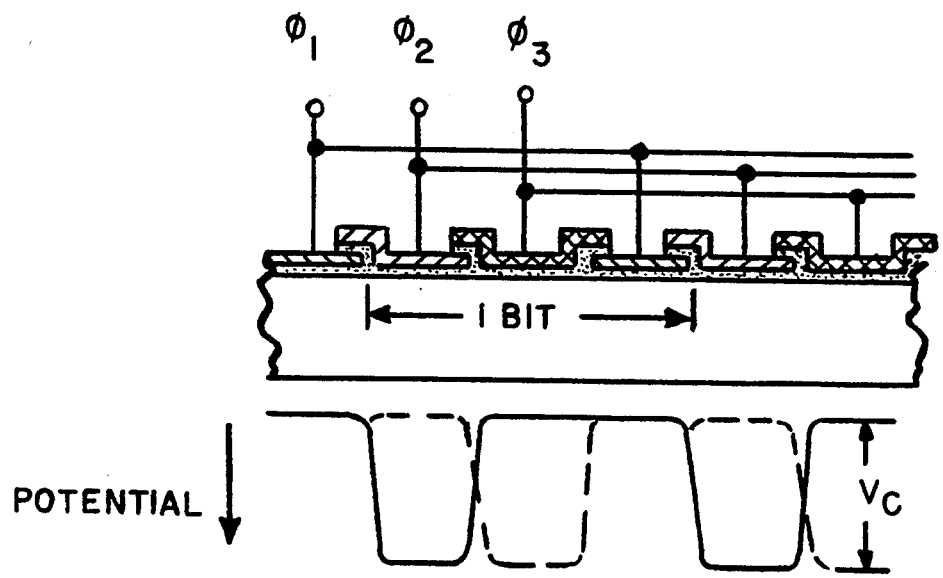
Figure 14:
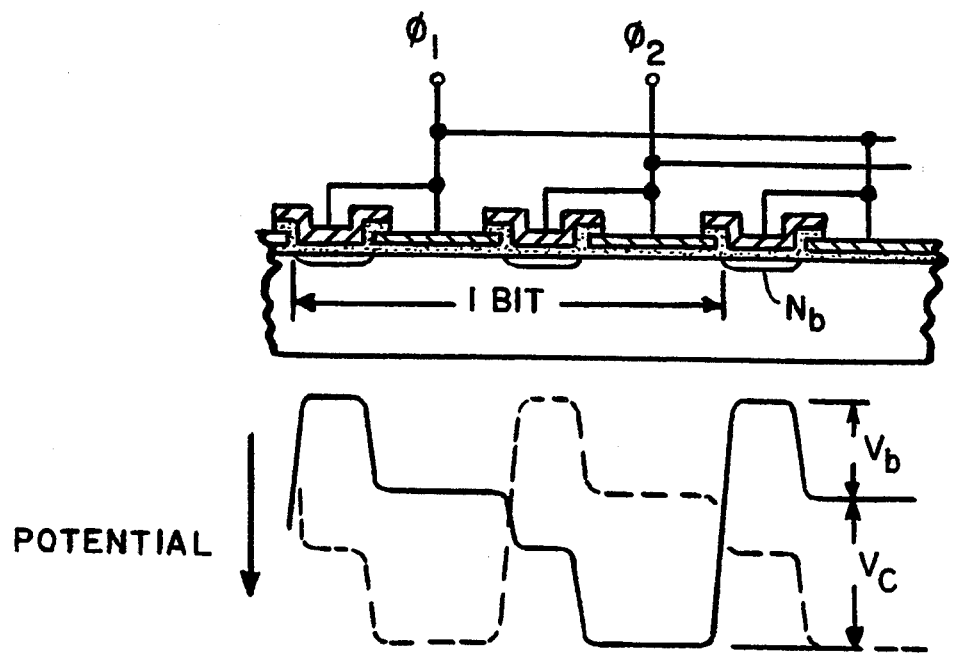

On the other hand, when the first and second regions is made by implanting the same conductivity type, the second region is formed inside the first region and contacts the boundary thereof. Such examples are shown in FIGS. 10A and 11. In the CCD of FIG. 10A, the implanting conductivity type in the second region 30 is the same as that in the first region 28 and also as that in the buried channel 2, and the lower stream end of the second region 30 is in contact with that of the first region 28. In the CCD of FIG. 11, the implanting conductivity type in the second region 34 is the same as that in the first region 32 but different from that in the buried channel 2, and the upper stream end of the second region 34 is in contact with that of the first region 32.

The position of the second region is thus determined depending upon its implanting conductivity type, in order that the conductivity type in the second region effects the directionality of potential depth established under the transfer electrodes 4 and 5 in the charge transfer direction.

In the embodiments shown in FIGS. 10A and 11, the potential shifts established by the first and second regions are in the same direction, and a potential produced by an applied given voltage is different between the first electrode and the second electrode. In this case, a driving system in which a DC voltage is used as one of the two-phase clocks is suitable.

Figure 10B:
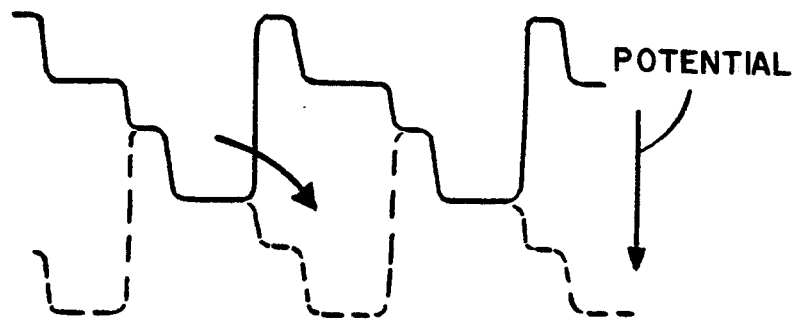
FIG. 10B is a diagram illustrating the potential distribution of the embodiment of FIG. 10A.

In the embodiment shown in FIG. 10A, the transfer clock pulse $\phi_1$ shown in (a) of FIG. 4 may be applied only to the transfer electrode 4, while a DC voltage of a predetermined level may be applied to the other transfer electrode 5. This DC voltage can be set at a level slightly higher than the low level potential of the transfer clock pulse $\phi_1$. By this setting, when the transfer clock pulse $\phi_1$ goes to the high level as shown in FIG. 10B, the potential well is formed as shown by the broken line, thereby maintaining the fringing electric field and thus transferring the signal charge from left to right in the figure. This transfer system for signal charge is termed a 1-($\frac{1}{2}$)-phase drive system.

The 1-($\frac{1}{2}$)-phase drive system may be employed in the embodiment shown in FIG. 11. In this case, however, the situation is reversed from that in FIG. 10A, and the transfer clock pulse $\phi_1$ is applied to the transfer electrode 5, while the predetermined DC voltage is applied to the transfer electrode 4.

When assuming the concentration of the N-conductivity positive and that of the P-conductivity type negative, the relationships between the concentrations in the above-described embodiments ($C_1$: the buried channel 2, $C_2$: the first region 6, 24, 28 or 32, $C_3$: the second region 7, 26, 30 or 34) can be summarized as follows:

Embodiment of FIG. 1A: $C_2 > C_1 \approx C_3$,
Embodiment of FIG. 9: $C_2 < C_1 \approx C_3$,
Embodiment of FIG. 10A: $C_1 < C_2 < C_3$,
Embodiment of FIG. 11: $C_1 > C_2 > C_3$.

The present invention can also be applied, by slightly modifying the implanted regions, to cases where the conductivity types are opposite from those described above. Also, the transfer channel type is not limited to the buried-channel type, but the surface-channel type may also be used. Furthermore, the invention may be embodied in other types of charge transfer device than CCDs.

As described, according to the construction of the invention, since the bit density can be made two times as great as that of the prior art device, the device size in the charge transfer direction can be reduced to about half that of the prior art construction. In other words, the charge transfer device of the invention is capable of handling twice as much information with the same electrode density as that of the prior art construction, and thus offers the advantage that an increase in the density can be easily achieved.

The production method of the invention provides the advantage that directionality of charge transfer can be built under each single electrode without causing potential barriers or dips.

Accordingly, the charge transfer device of the present invention is extremely advantageous for application to two-dimensional image sensors and the like.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of producing a charge transfer device, comprising the steps of
   (a) forming a first electrode layer over a semiconductor substrate through an insulating layer;
   (b) forming a first film and a first resist layer on said first electrode layer, said first film and said first resist layer having the same pattern;
   (c) implanting a first impurity into said substrate through said first electrode layer and said insulating layer, with a high energy and using said first film and said first resist layer as a mask;
   (d) removing said first resist layer;
   (e) forming a second resist layer, said second resist layer extending from said first film at one end and to the center portion of gaps in said first film at the other end;
   (f) etching said first electrode layer to form first transfer electrodes using said first film and second resist layer as a mask, said etching process being conducted so that the selectivity of said first electrode layer with respect to said first film is substantially great;
   (g) removing said second resist layer;
   (h) forming a third resist layer, said third resist layer extending from one of said first transfer electrodes at one end and to the center portion of gaps in said transfer electrodes at the other end;
   (i) implanting a second impurity into said substrate through said insulating film, using said third resist layer and said first transfer electrodes as a mask;
   (j) removing said third resist layer; and
   (k) forming second transfer electrodes.

* * * * *